United States Patent [19]
Shumka

[11] 3,860,946
[45] Jan. 14, 1975

[54] SPACE-CHARGE-LIMITED SOLID-STATE TRIODE

[75] Inventor: Alex Shumka, La Canada, Calif.

[73] Assignee: California Institute of Technology, Pasadena, Calif.

[22] Filed: Oct. 13, 1972

[21] Appl. No.: 297,436

[52] U.S. Cl. .................................................. 357/22
[51] Int. Cl. ............................................ H01l 29/78
[58] Field of Search ............................... 317/235, 21

[56] References Cited

UNITED STATES PATENTS

| | | | |
|---|---|---|---|
| 3,270,258 | 8/1966 | Gault | 317/235 |
| 3,384,792 | 5/1968 | Kazan et al. | 317/235 |
| 3,651,489 | 3/1972 | Beutel | 340/173 |

*Primary Examiner*—Rudolph V. Rolinec
*Assistant Examiner*—E. Wojciechowicz
*Attorney, Agent, or Firm*—Lindenberg, Freilich, Wasserman, Rosen & Fernandez

[57] ABSTRACT

A solid-state triode is provided from a wafer of near-intrinsic semiconductor material sliced into filaments of rectangular cross section. Before slicing, emitter and collector regions are formed on the narrow sides of the filaments, and after slicing gate regions are formed in narrow strips extending longitudinally along the midsections of the wide sides of the filaments. Contacts are then formed on the emitter, collector and gate regions of each filament individually for a single filament device, or in parallel for an array of filament devices to increase load current.

10 Claims, 5 Drawing Figures

SPACE-CHARGE-LIMITED SOLID-STATE TRIODE

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2,457).

BACKGROUND OF THE INVENTION

This invention relates to a solid-state triode, and more particularly to a space-charge-limited solid-state triode.

A space-charge-limited solid-state triode (SCLT) that is similar in operation to the vacuum-tube triode is highly sought after because, having some characteristics like those of a field-effect transistor (FET), particularly a high input impedance, the SCLT has the following advantages: lower noise figure, larger power capability, higher operating temperatures tolerable, higher radiation resistance, and higher frequency response.

A basic difference between the SCLT and the FET is that the FET operates on the ohmic current through the channel, while the SCLT operates on the space-charge current. Consequently, to achieve the SCLT in a solid-state device, and its attendant advantages, the base material must be near-intrinsic, and the base must be maintained as pure as possible throughout the fabricating steps.

A number of solid-state triodes have been devised. One of these is found described in a U.S. Pat. No. 3,056,888 to M. M Atalla. The device described therein comprises a near-intrinsic silicon wafer ($\pi$-type) which includes a high resistivity base portion. These spaced surface portions are on one surface of the wafer. Ohmic contacts are made to the two spaced surface portions to provide emitter and collector electrodes. The area between these two spaced surface portions is covered with a thin film of dielectric material. A gate electrode is then deposited on this dielectric film to provide an arrangment similar to an insulated-gate FET. The electric field produced in response to a potential applied to the gate is effective as a space-charge-limited current control means only to a shallow depth in view of the geometry. The fabrication techniques require very careful processing to establish both the depth of diffusion of the low resistivity spaced surface portions as well as their geometry and spacing. Furthermore, a dielectric film must be used to separate the gate electrode from the near-intrinsic base portion, thereby limiting high frequency response.

Another solid-state triode is disclosed in U.S. Pat. No. 3,269,533 by G. T. Wright. Several embodiments are shown using a ferroelectric crystal such as lead zirconate, or high permitivity para-electric crystal such as cadmium sulphide, zinc sulphide or the like, for the base material. Basically, the arrangement in each embodiment is one wherein the gate (control electrode) and the emitter (anode) are on one surface of the semiconductor wafer and the collector (cathode) is on the other surface of the semiconductor wafer. This places the controlling field adjacent the anode, and again makes for difficult manufacturing techniques because of the close attention that must be paid to geometry or spacing. Also, for best results the device requires insulating crystalline material for the base with a resistivity between $10^9$ and $10^{11}$ ohm cm. It is difficult to find materials of that resistivity to be relatively trap free.

In U.S. Pat. No. 3,250,367 to A. Rose, a solid-state triode is disclosed which comprises emitter and collector portions of a bandgap material that make abrupt blocking contacts to opposite sides of a common thin conducting layer or grid, made of a metal or a degenerate semiconductor. A thin layer of an insulator (substantially intrinsic material) is interposed between the emitter and the grid. It is difficult to obtain reliable thin insulating layers and thin grids that are transparent to injected carriers.

Jerome Kurshan discloses in U.S. Pat. No. 2,820,154 a device including a body of substantially intrinsic germanium or silicon having slots formed therein with emitter electrodes of a given conductivity type formed on the projections between the slots and a collector electrode of the same conductivity type formed on the other side of the body opposite emitter electrodes. A control electrode of opposite conductivity type is formed in the body of the intrinsic material across the bottom of each of the slots.

An improvement over that structure of Kurshan, made by the present inventor, has been reported in Electronic Design, Vol. 10, No. 6, on Mar. 14, 1968, at pages 38 and 40. That improvement consists of forming control (gate) electrodes at only the corners of the slots. To accomplish that, narrow strips of material of the opposite conductivity type are alloyed to both sides of projections at the very bottom of the groove. The control electrodes are thus placed more in the active region between emitter and collector electrodes for a direct effect on current flow between the emitter and collector electrodes than if the control electrodes were to be placed on the bottom of the slots between the projections.

The improved device utilizes the space-charge-limited current phenomenon and is characterized by high input impedance (comparable to that of a reverse-biased p-n junction), relatively high voltage operation, and a high amplification factor. In addition, the device has a low noise figure, low susceptibility to radiation effects and low sensitivity to temperature changes. However, fabrication of the device is difficult, primarily because the control electrodes require an elaborate masking procedure to produce extremely narrow grooves (preferably not more than 1 mil wide) in the corners of the slots because the corners are, in practice, curved surfaces. The grooves are necessary to place the material selected for the control electrodes in position for proper alloying into the body of the device. What is desired is a more readily fabricable configuration for the same improved device.

SUMMARY OF THE INVENTION

In accordance with the present invention, a wafer of near-intrinsic material is prepared with broad emitter and collector regions on opposite sides. The wafer is then cut into filaments of rectangular cross section, leaving the emitter and collector regions on opposite narrow sides. Gate regions are then formed in narrow strips extending longitudinally along the midsections of the remaining opposed sides of each filament. Each filament constitutes a triode when ohmic contacts are made to the emitter and collector regions, and a common ohmic contact is made to the two gate regions. A multiple triode for higher current capacity is formed by an array of filaments with a common contact to the emitter regions of each, a common contact to the collector regions of each and a common contact to both gate regions of each filament.

DESCRIPTION OF THE PREFERRED EMBODIMENTS

Figure 1:
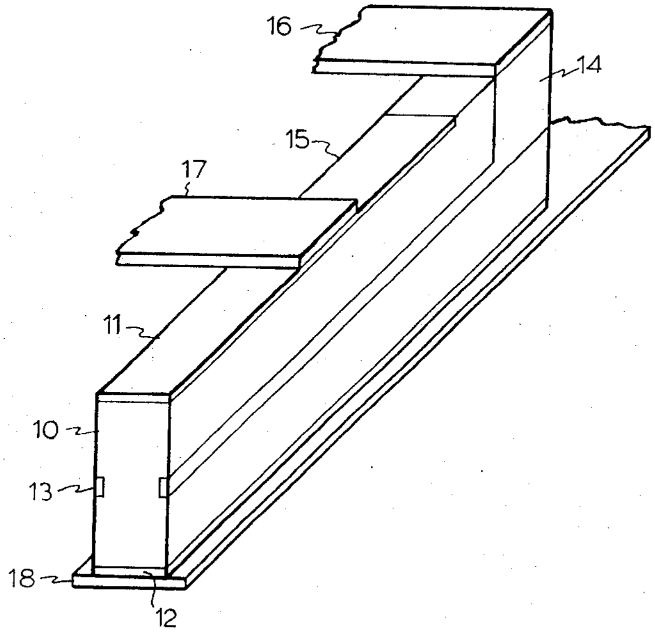
FIG. 1 is an isometric view of an embodiment of the invention.
Figure 2:
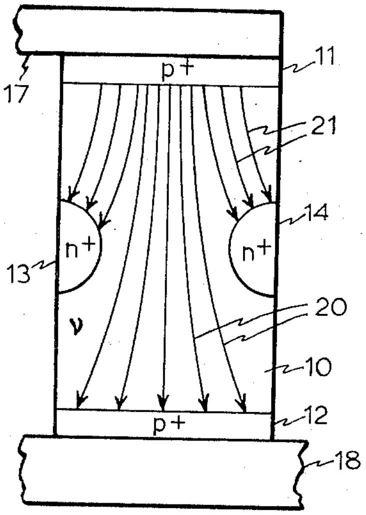
FIG. 2 is an enlarged end view of said embodiment.

Referring now to FIG. 1, there is shown an isometric view of an embodiment of this invention. FIG. 2 is an enlarged end view of FIG. 1. For the purposes of this description, a specific embodiment will be described. This should not be construed as a limitation upon the invention since those skilled in the art would readily appreciate what departures from the described embodiment can be made within the scope of the invention.

An elongated body 10 of rectangular cross section is prepared with two $p^+$ regions 11, 12 on the opposite narrow sides. The body is of high purity silicon or germanium, such as a near-intrinsic $\nu$-type silicon (doping approximately $10^{12}$ donors per cubic centimeter). The two regions 11, 12, which are to be used as the emitter and collector of the device may be formed, for example, by alloying aluminum in the silicon body.

The body is preferably approximately 0.13 mm on the dimension between the surfaces of the regions 11 and 12, and approximately 0.06 mm on the narrow sides between the faces into which regions 13, 14 are formed, again by alloying $n^+$ material, such as antimony. These electrodes should extend rearwardly beyond the region 11, and upwardly to a clear surface 15 on the same plane as the surface of the region 11.

It should be noted that either end region may be used as the emitter and the other as the collector; it is merely a matter of choice in biasing the device for operation. For discussion, the region 11 is selected to be the emitter and the region 12 is selected to be the collector. The side regions 13, 14 are always used together as the gate. To accomplish that, the regions 13, 14 are joined across the surface 15 and an ohmic contact 16 is made on the surface 15 to the joined upper extremities of the regions 13, 14 as shown for the region 14. These gate regions may, in practice, be joined across the surface 15 by alloying the contact 16. Contacts 17 and 18 are made to the regions 11 and 12 to complete the device.

FIG. 2, an enlarged end view of FIG. 1 is used to explain the operation of the device. Based on the assumption that the collector is maintained negative with respect to the emitter, and that the two gate regions 13, 14 are connected in parallel to a potential positive with respect to the emitter, field lines 20 (the only field lines of consequence in the space-charge-limited operation of this device) emanate from the emitter and terminate on the collector. Other field lines 21 emanate from the emitter and terminate on the gates. The current flow between the emitter and the collector is related to the number of field lines terminating on the collector. This number can be modulated by varying the gate voltage. That is, by increasing the gate voltage, more field lines will terminate on the gates, resulting in fewer field lines terminating on the collector. In that manner the gate-to-collector capacitance modulates the space-charge current through the device. The foregoing is a simplification of the actual situation in which field lines will, in practice, emanate from the charges injected from the emitter, but such a simplification aids in understanding the concept of space-charge limited current.

Figure 3:
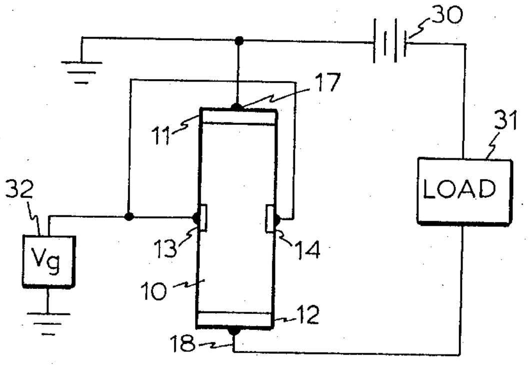
FIG. 3 is a schematic diagram of the embodiment of the invention, illustrating electrical connections thereto.

Referring now to the schematic diagram of FIG. 3, the elements of the triode bear the same reference numerals as are shown in FIGS. 1 and 2. A source of operating potential 30 has its negative terminal connected to the collector through a load 31 and its positive terminal connected to ground and to the emitter. A gate control source 32 is connected between the gates and the emitter. That source is shown as a bias voltage $V_g$, but in practice will include a source of a signal to be amplified.

Figure 4:
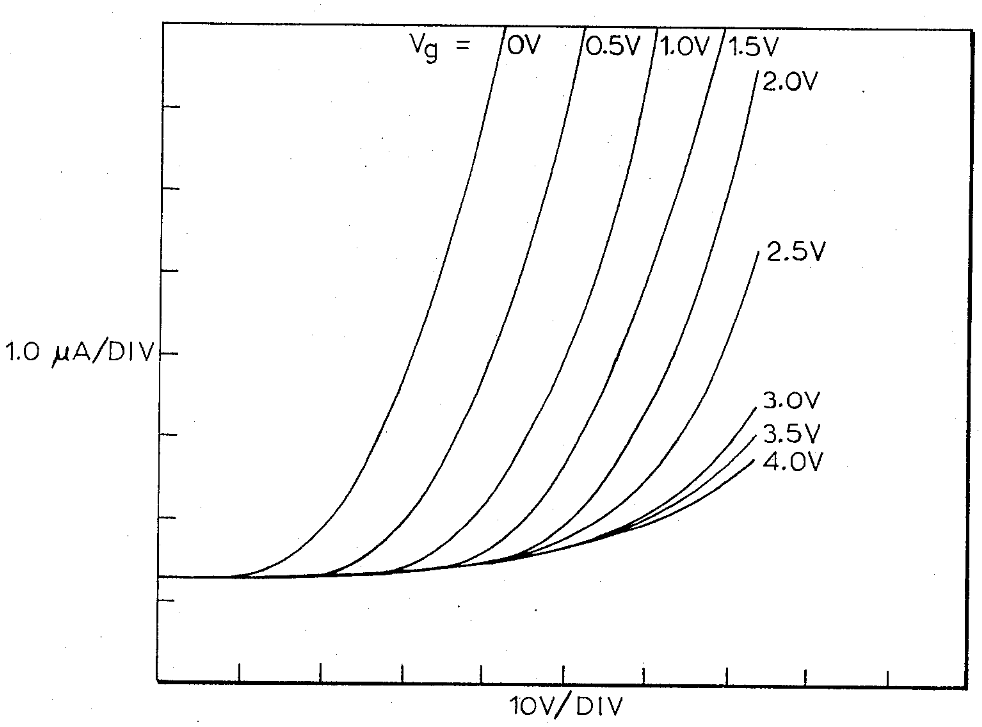
FIG. 4 shows a I–V characteristic of a triode made in accordance with this invention.

FIG. 4 is a graph of the characteristic curves of an embodiment of the invention which was built as described and successfully operated, and which had the circuit arrangement shown in FIG. 3. The gate bias $V_g$ was maintained constant at the value shown adjacent each curve while the voltage applied between emitter and ground was increased up to a value in excess of 70 volts.

Figure 5:
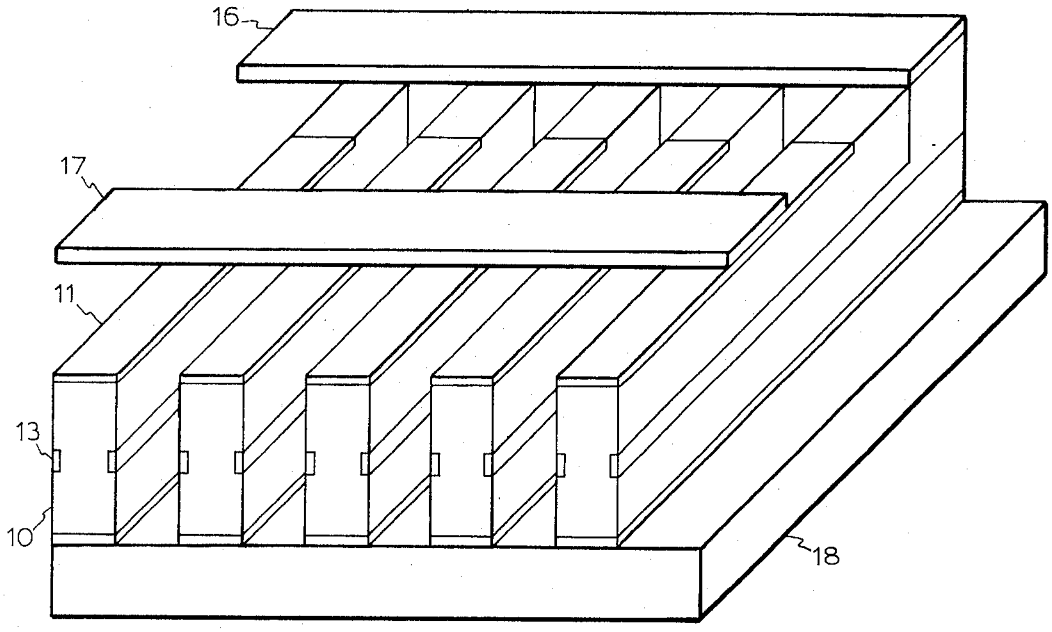
FIG. 5 illustrates an array of solid-state triodes for higher current capacity.

It can be seen from the characteristic curves that substantial currents may be controlled with this invention. If it is desired to increase current capacity, a plurality of these triodes may be arranged in an array and connected in parallel as shown in FIG. 5. The emitter contact 17 is extended to make ohmic contact with the emitter region 11 of every filament, five of which are shown, although any number can be provided. The gate contact 16 is similarly extended to make ohmic contact with both gate regions 13, 14 of every filament. The collector contact 18 is also extended to not only make ohmic contact with the drain region 12 of every filament, but also to support the filaments in the array.

In some applications, it may be desirable to so package an array of triodes as to provide a direct connection between circuit ground and the collector regions, rather than the emitter regions as shown in FIG. 3. In that event, the roles of the contacts 17, 18 may be reversed without any appreciable effect on the characteristics of the array. This is so because, as shown, the triodes are almost symmetrical, and can be made even more so by extending the area of the contact 17, but that is not necessary because the impedance of the emitter region 11, now used as the collector, is very low as compared to the body 10 and the impedance of the contact 17. It is more desirable to maintain the area of the contacts 16 and 17 between elements as small as possible to minimize external capacitance of the device. To that end, it may be desirable to support the array on a block of dielectric material, and employ only a narrow strip of conductive material on the block to provide the contact 18.

An array of triodes can obviously increase the load current capability over that of a single triode, but the array is still not suitable for very high load current applications. However, an array can serve as a medium power amplifier, as an impedance transformer, as a driver and as a mixer, as well as a general purpose amplifier with a relatively high input impedance and a high amplification factor. It is particularly suitable for use in hostile environments as it is relatively insensitive to the effects of radiation.

A preferred method for forming these triodes begins with a wafer of near-intrinsic semiconductor material approximately 0.15 mm thick. Emitter and collector diffusion is then accomplished on opposite faces of the wafer with appropriate geometry for the diffusion on one side vis-a-vis the diffusion on the other side to allow space for ultimately providing the gate contacts. Another method would have identical diffusions for emitter or collector followed by an etch to remove that diffused portion reserved for the gate contacts. The wafer is then sliced into filaments approximately 0.06 mm wide. Masking is applied to the broad sides of each filament, and gates are diffused. Device contacts are finally connected, as by metallizing contact areas and then brazing the contacts.

An alternate technique for forming the gate regions is by alloying thin strips of suitable material into opposite wide sides of the device by use of laser energy. The sides of the filament may first be masked to receive the strip of material to be alloyed. A focused laser beam is then scanned along the strip with the laser spot spanning the strip with sufficient overlap to form a 0.06 mil wide gate region.

In fabricating devices according to the present invention, the selected spacing ($L$) between the emitter and the collector, i.e., the thickness of the starting wafer, will depend upon the desired triode characteristic, e.g., higher voltage capability. Another consideration is the diode current ($I$) capacity (i.e., capacity before gates are added) given by the equation $$I = k\ V^2 / L^3$$

where $k = 9/8\ \epsilon\mu$ $A$ = area of emitter region $\epsilon$ = dielectric constant for base material $\mu$ = mobility of injected carrier $V$ = applied voltage For control of the device amplification factor, the gates are provided with a selected distance $d_1$ from the emitter and a selected distance $d_2$ between the gate regions. Increase of $d_1$ and decrease of $d_2$ will increase the amplification factor, although quite obviously neither can be changed without limit. In practice, the dimensions L and $d_2$ are chosen and the value of $d_1$ is selected, usually equal to approximately half of L such that the desired value of the amplification factor is obtained. The spacing L is smaller than the corresponding spacing between source and drain normally used for construction of FET devices, and in practice is made as small as possible for increased current capacity. In an FET, that spacing does not appreciably affect current capacity and is therefore made large for convenience in fabricating the gates.

To offset any limitation of current in devices of the present invention resulting from an increase in the spacing L necessary for the gates, the area of the emitter region can be significantly increased by starting with a larger wafer from which the filaments are cut.

The amplification factor desired is then provided by proper selection of the distance $d_1$ of the gate regions from the emitter region, the last remaining variable parameter after thickness of the wafer is set and the thickness for the filaments is selected. Increasing the distance $d_1$ increases the amplification factor. Decreasing the thickness of the filaments sliced from the wafer, to decrease the distance between the gate regions, will also increase the amplification factor, but that distance is, in practice, selected more from the practical considerations of slicing the filaments, leaving the selection of the gate distance from the emitter as the final control parameter for the amplification factor.

Other semiconductor materials, besides silicon and germanium could be used, but these mentioned are the most readily available in the required purity, and of these, silicon is preferred because of its highly advanced technology, such as diffusion, and its wider band gap. Once the base material is selected, the device can be formed with the geometry substantially as shown and described using all manner of techniques known for providing the abrupt junction between the body and the emitter, collector and gate regions.

While the device described was considered to have a silicon body of the $\nu$-type (near-intrinsic $n$-type) of semiconductor material, it can be of the $\pi$-type (near intrinsic $p$-type). In that event, the emitter and collector are made $n^+$ such as by alloying or diffusing antimony, and the gates are made $p^+$, such as by alloying aluminum. If the body were germanium, then still other choices of materials would be made as the source of impurities.

What is claimed is:

1. A space-charge-limited solid-state triode comprising:

- a filament of semiconductor of near-intrinsic material, said filament having a substantially rectangular cross section,
- an emitter region of a selected type of conductivity, said region being formed with a high concentration of impurities distributed along one narrow side of said filament,
- a collector region of the same type of conductivity as said emitter region, said collector region being formed with a high concentration of impurities distributed along a narrow side of said filament opposite said one narrow side,
- separate ohmic contacts made to said emitter and collector regions,
- gate regions of a conductivity type opposite said one type, said gate regions being formed with high concentration of impurities distributed in narrow strips extending longitudinally along the midsections of both wide sides of said filament,
- ohmic contacts made to said gate regions, and
- means for connecting said gate contacts together to form a single control electrode.

2. A space-charge-limited solid-state triode as defined in claim 1 having a plurality of like filament structures, each with emitter, collector and gate regions, said filament structures being arranged in an array with a common contact to said emitter region of every structure, a common contact to said collector region of every structure, and a common contact to said gate regions of every structure, thereby providing a plurality of space-charge-limited triodes in parallel for increased current capacity.

3. A space-charge-limited solid-state triode as defined in claim 2 wherein one of said emitter and collector contacts is at least as wide as said array and at least as long as each filament to provide a supporting base for said array, and wherein each of the remaining contacts is narrow to minimize inter-electrode capacitance.

4. A space-charge-limited solid-state triode as defined in claim 1 wherein a selected one of said emitter and collector regions extends less than the full length of said filament to leave a space on one narrow side for said ohmic contact to be made to said gate regions, and wherein said gate regions extend to said space.

5. A space-charge-limited solid-state triode as defined in claim 4 having a plurality of like filament structures, said filament structures being arranged in an array with a common contact to gate regions of every device by a conductor extending across all of said filaments and an ohmic contact with every gate region in said space of every filament, an ohmic contact to said selected one of said emitter and collector regions of every filament in the form of a conductor extending across all of said filaments and a common contact to the unselected one of said emitter and collector regions of every filament in the form of a conductor extending across all of said filaments.

6. A space-charge-limited solid-state triode as defined in claim 5 wherein at least two of said conductors extending across all of said filaments are narrow as compared to the length of each and the length of said filaments to minimize capacitance between said contacts.

7. A method of producing a space-charge-limited solid-state triode comprising the steps of preparing a wafer of near-intrinsic semi-conductor material of selected thickness with opposing broad area regions of one type of conductivity, slicing said wafer into a plurality of filaments which are narrower than said wafer is thick, thus producing each filament to have a rectangular cross section with wide sides, preparing at least one filament with narrow opposing gate regions extending longitudinally along the midsections of both of said wide sides, said gate regions being of a conductivity type opposite said one type, making separate ohmic contacts to both of said opposing regions that were prepared before slicing said wafer, and making a common ohmic contact to both of said opposing gate regions.

8. A method as defined in claim 7 wherein a plurality of filaments are prepared with narrow opposing gate regions in the same manner and said plurality of filaments are arranged in an array before making separate ohmic contacts to both of said opposing regions in common to each filament and making a common ohmic contact to both of said opposing gate regions of every filament, thereby providing a plurality of space-charge-limited triodes in parallel for increased current capacity.

9. A method as defined in claim 7 wherein said wafer thickness is selected to provide a selected spacing L between said opposing broad area regions of one type of conductivity, and said broad area regions are provided so that one of said opposing broad area regions of a sliced filament will have a selected area A for a diode current capacity of the structure without said gate regions given by the equation $$I = kV^2/L^3$$

where $k = 9/8\ A\epsilon\mu$ $\epsilon$ = dielectric constant for material of said wafer $\mu$ = mobility of injected carrier $V$ = applied voltage across said structure between said opposing broad area regions.

10. A method as defined in claim 9 wherein said filaments are sliced with a predetermined thickness to provide a spacing $d_2$ between said gate regions and said gate regions are provided with a selected distance $d_1$ from one of said opposing broad area regions to be used as an emitter, said distance $d_1$ being selected to provide the desired amplification factor for the distance $d_2$, where increasing the distance $d_1$ of the gate regions from the emitter region increases the amplification factor and decreasing the distance $d_2$ between gate regions increases the amplification factor.

* * * * *